United States Patent
Ulmer et al.

(10) Patent No.: US 6,256,880 B1
(45) Date of Patent: Jul. 10, 2001

(54) METHOD FOR PREPARING SIDE ATTACH PAD TRACES THROUGH BURIED CONDUCTIVE MATERIAL

(75) Inventors: Kenneth R. Ulmer, Brazoria; John M. Cecere, Lake Jackson, both of TX (US)

(73) Assignee: Intermedics, Inc., Angleton, TX (US)

( * ) Notice: Subject to any disclaimer, the term of this patent is extended or adjusted under 35 U.S.C. 154(b) by 0 days.

(21) Appl. No.: 09/156,205

(22) Filed: Sep. 17, 1998

(51) Int. Cl.$^7$ ..................................................... H01K 3/10
(52) U.S. Cl. ................................ 29/852; 29/411; 29/412; 29/846; 29/849; 174/261; 174/262; 174/264; 83/929.1; 427/97
(58) Field of Search ............................ 29/411, 412, 852, 29/849, 846; 174/261, 264, 262; 427/96, 97; 83/929.1, 929.2

(56) References Cited

U.S. PATENT DOCUMENTS

| | | | |
|---|---|---|---|
| 4,266,282 | 5/1981 | Henle et al. | 365/52 |
| 4,426,689 | 1/1984 | Henle et al. | 365/52 |
| 4,562,092 | 12/1985 | Wiech, Jr. | 427/58 |
| 4,677,527 | 6/1987 | Pasterchick, Jr. et al. | 361/395 |
| 4,994,215 | 2/1991 | Wiech, Jr. | 264/27 |
| 5,185,292 | 2/1993 | VanVonno et al. | 437/180 |
| 5,356,838 | 10/1994 | Kim | 437/226 |
| 5,412,537 | 5/1995 | Magill et al. | 361/777 |
| 5,552,631 | 9/1996 | McCormick | 257/666 |
| 5,600,101 * | 2/1997 | Sakai | 29/852 |
| 5,623,160 | 4/1997 | Liberkowski | 257/621 |
| 5,668,409 | 9/1997 | Gaul | 257/723 |
| 5,684,273 | 11/1997 | Erdle et al. | 174/72 B |
| 5,716,663 * | 2/1998 | Capote et al. | 427/96 |
| 5,726,857 | 3/1998 | Salmonson et al. | 361/702 |
| 5,741,148 | 4/1998 | Biernath | 438/284 |
| 5,789,278 | 8/1998 | Akram et al. | 438/118 |
| 5,847,930 | 12/1998 | Kazle | 361/736 |
| 5,851,645 | 12/1998 | Glowasky et al. | 428/221 |
| 5,892,285 | 4/1999 | Gonzalez et al. | 257/763 |
| 5,976,930 | 11/1999 | Noble | 438/253 |
| 6,002,180 | 12/1999 | Akram et al. | 257/783 |

OTHER PUBLICATIONS

Morgenstern, Howard; Bandler, Sam; Barner, Gregg; "Characterization of Printing and Laser Trimming of DuPont 200 Series Resistors on DuPont 951 'GreenTape'", Proceedings of the International Symposium on Microelectronics (SPIE), 1996, pp. 49–54.

* cited by examiner

Primary Examiner—Lee Young
Assistant Examiner—Rick Kiltae Chang
(74) Attorney, Agent, or Firm—Schwegman, Lundberg, Woessner & Kluth, P.A.

(57) ABSTRACT

A circuit substrate utilizes buried edge connectors. The buried edge connectors are mechanically disposed within the edge of the substrate and have substantial thickness. The configuration and method for making the same provides relatively large edge connectors mechanically constrained in the edge of a circuit substrate.

15 Claims, 3 Drawing Sheets

METHOD FOR PREPARING SIDE ATTACH PAD TRACES THROUGH BURIED CONDUCTIVE MATERIAL

BACKGROUND OF THE INVENTION

1. Field of the Invention

The present invention relates generally to circuit substrates, and particularly to circuit substrates that utilize conductive contacts along the sides or edges of the substrate.

2. Background of the Related Art

Circuit substrates, such as circuit boards, are electronically connected to other components through conductive contacts disposed in or on the substrate. Conventionally, components were attached to contacts located on the top or bottom surface of the circuit substrate. The components were attached, for instance, by soldering conductive component leads to the appropriate contacts.

As devices utilizing circuit substrates have decreased in size, there has been great demand for miniaturization of the circuit substrate. This demand has prompted attempts to utilize the sides or edges of the substrate for attachment of some components. Accordingly, the conductive contacts to which the components are connected also have been moved to the edges of the circuit substrate.

One approach has been to use screen printed metallization for placing conductive contacts along the edge of a given circuit substrate. The components are then attached to these conductive contacts by known methods.

The screen printing technique can be problematic, because the metallization at each contact is relatively thin, which can lead to excess material leaching. The end result is loss of adhesion between the conductive contact and the attached component. Additionally, the relatively thin metallization allows for only limited rework applications before undue degradation of the conductive contact.

It would be advantageous to have thicker, more durable conductive contacts along the edges of a circuit substrate to facilitate attachment of various components thereto.

SUMMARY OF THE INVENTION

The present invention includes a method for providing metallized conductors along the edge of a circuit board. The method includes stacking a plurality of uncured layers of a circuit substrate, and forming at least one via through the plurality of layers. The method also includes filling the at least one via with a metallized conductive material; covering the at least one via with a cover layer; and providing a vent to the at least one via to exhaust any gases created during processing.

According to another aspect of the invention, a method is provided for creating a circuit board substrate with edge connectors. The method includes providing a bottom layer of a green laminate. The method further includes stacking a plurality of layers of the green laminate on the bottom layer, and aligning apertures in each layer of the plurality of layers to create a via. The method also includes filling the via with a conductive material, and connecting a vent to the via for exhaustion of byproduct gases during firing of the green laminate.

According to yet another aspect of the invention, a method is provided for creating a circuit board with a buried edge connector. The method includes creating a via within a plurality of layers of a laminate. The method also includes filling the via with a conductive compound, venting the via, and curing the laminate. Additionally, the method includes dicing the laminate through the via to expose the conductive compound along an edge of the laminate.

BRIEF DESCRIPTION OF THE DRAWINGS

The invention will hereafter be described with reference to the accompanying drawings, wherein like reference numerals denote like elements, and.

DESCRIPTION OF SPECIFIC EMBODIMENTS

Preferred embodiments of the present invention include both a device and method by which buried edge connectors may be placed in circuit substrates, such as circuit boards. One exemplary type of circuit board for which this invention is particularly beneficial is an integrated seal ring (ISR) of the type used in manufacturing compact devices, such as implantable medical devices.

As circuit substrates have undergone continued miniaturization, it has become more desirable to utilize the sides or edges of the substrate for placement of conductive contacts to which desired components may be connected for conduction of electrical signals. The present invention includes a method for providing a conductive pad, typically a metallized pad, that is buried in the edge of a circuit substrate, such as an ISR. The inventive buried contacts have added strength and longevity, while permitting attachment of components by traditional solder or brazing techniques.

According to a preferred embodiment of the present invention, vias are formed in the substrate layers, e.g. the layers of "green tape," prior to firing or curing of the circuit substrate. The green tape typically comprises a ceramic material, as is commonly used in the industry.

The vias are filled with a conductive material, and additional layers of the substrate are built up above and below the vias. Thus, the conductive material is surrounded by the green tape material. The assembly is then fired and diced through the vias to expose the conductive, buried edge connectors.

Figure 1:
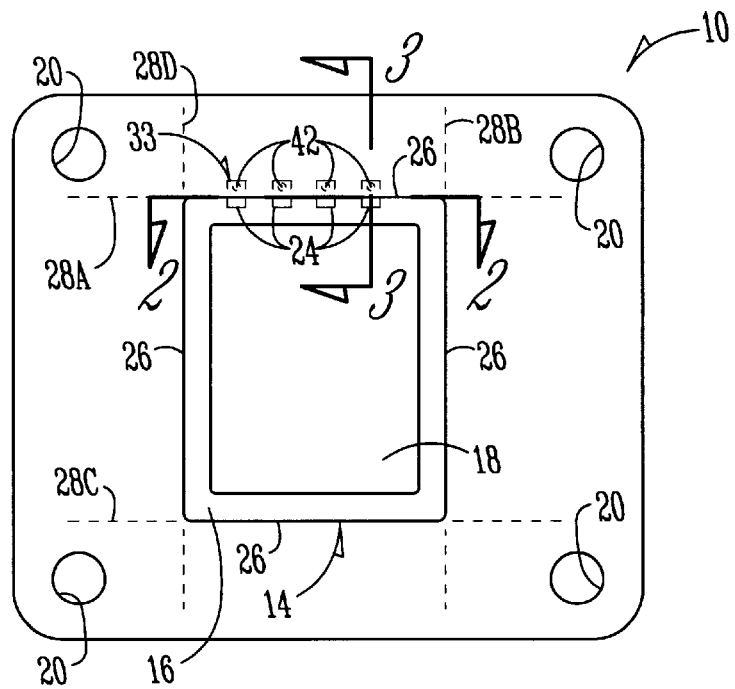
FIG. 1 is a top view of a circuit substrate, according to a preferred embodiment of the present invention, prior to being diced or cut from its surrounding laminate.

The device and method of the present invention may be more fully understood with reference to FIGS. 1 through 7. Referring first to FIG. 1, a circuit substrate assembly 10 is illustrated according to a preferred embodiment of the present invention. Circuit substrate assembly 10 includes a plurality of substrate layers 12 (see FIG. 2) that are stacked to a thickness required by a desired circuit substrate 14. In this particular illustrated embodiment, circuit substrate 14 comprises an integrated seal ring (ISR) having an outer ring 16 and an inner recessed area 18. The circuitry for a given circuit substrate design is disposed on at least some of the substrate layers 12, as is well known by those of ordinary skill in the art.

In forming circuit substrate assembly 10, the individual substrate layers 12 are selectively formed with desired apertures therethrough to achieve a desired end result. For example, a plurality of alignment holes 20 are formed through all of the substrate layers 12 external to circuit substrate 14. Holes 20 facilitate alignment of the individual substrate layers 12 during assembly and during the firing or curing of circuit substrate assembly 14.

Figure 2:
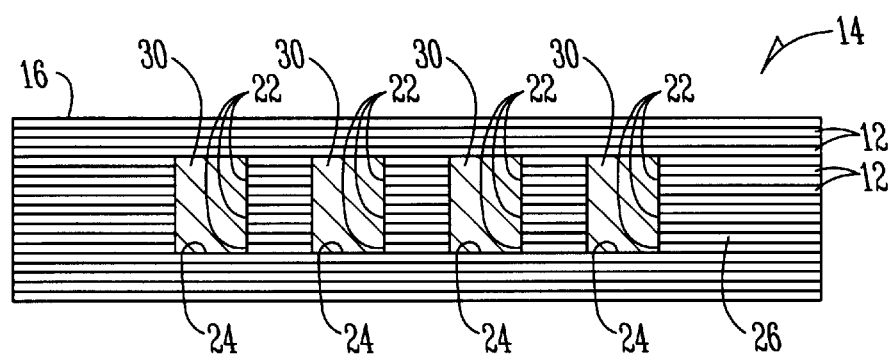
FIG. 2 is a cross-sectional view taken generally along the line 2—2 of FIG. 1.
Figure 3:
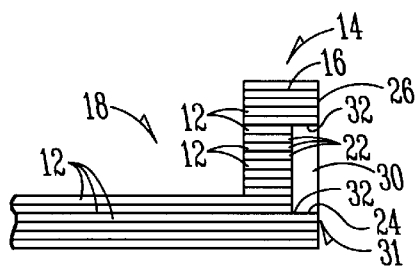
FIG. 3 is a cross-sectional view taken generally along line 3—3 of FIG. 1 after removal of the circuit substrate.

Additionally, selected substrate layers 12 are formed with one or more via openings 22. Openings 22 are located such that when substrate layers 12 are stacked above one another, via openings 22 form a desired via 24. For example, a plurality of vias may be formed along an edge or edges 26 of circuit substrate 14, as best illustrated in FIGS. 1–3. Other openings also may be formed in selected substrate layers 12 to create various features, such as inner recessed area 18, of circuit substrate 14.

Following curing, i.e., firing, of the circuit substrate assembly 10, circuit substrate 14 is removed. This may be accomplished by cutting circuit substrate 14 from the remainder of circuit substrate assembly 10. The cutting, commonly known as dicing, is performed along the perimeter of circuit substrate 14 as illustrated by lines 28A through 28D in FIG. 1. The dicing along line 28A passes directly through vias 24 to expose each buried edge connector 30. As will be explained more fully below, each buried edge connector 30 is formed from a conductive material inserted into one of the vias 24 prior to firing of circuit substrate assembly 10.

It should be noted that via openings 22 and vias 24 may be formed in a variety of shapes and configurations. In the embodiment illustrated in FIGS. 1–3, via openings 22, and therefore the cross-section of each via 24, is square or rectangular. It has been determined that this square/rectangular shape helps to securely hold each buried edge connector 30 within its corresponding edge 26. The design provides a mechanical mechanism 31, in the form of edges 32, that physically grips each buried edge of the connector 30 to prevent its detachment. The mechanical gripping provided by edges 32 increases the durability of each connector 30 because its attachment does not simply depend on adhesion of materials. There also may be other cross-sectional shapes that provide mechanical assistance in securely holding each buried edge connector 30 along its corresponding edge 26.

The present invention allows vias 24 to have a greater than expected diameter, e.g. thickness, (see diameter 33 illustrated in FIG. 1). For many fill materials used in filling other types of vias, it is recommended that the diameter 33 of the vias not exceed two times the thickness of a substrate layer 12. The present invention permits the filling of buried edge connector vias having a diameter greater than twice the individual layer thickness. Typically, the diameter of the via can be substantially greater than twice the substrate layer thickness without creating detrimental effects with respect to the edge connector. This permits the burying of larger edge connectors within edge 26 of substrate layers 12 to provide a stronger, more durable circuit substrate 14.

Figure 4:
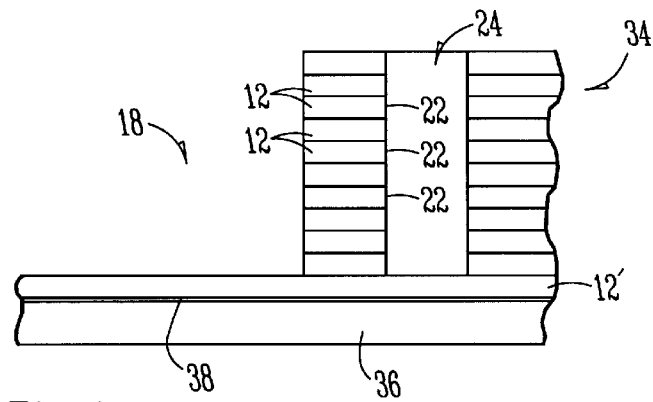
FIG. 4 is cross-sectional view, similar to that of FIG. 3, but showing an unfilled via within a circuit substrate, according to a preferred embodiment of the present invention.
Figure 5:
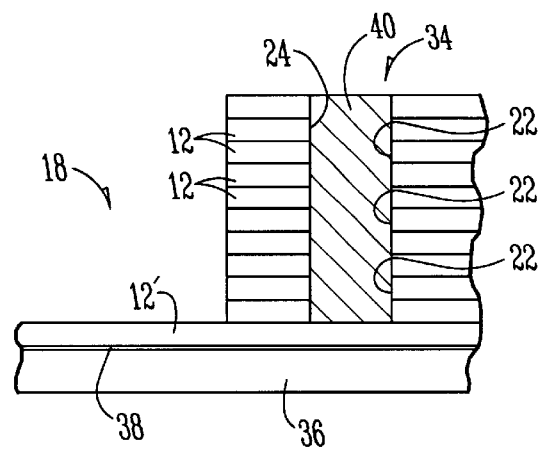
FIG. 5 is a cross-sectional view similar to that of FIG. 4 but showing the via filled with a conductive material.

The formation of circuit substrate 14, according a preferred method of the present invention, can be described with reference to FIGS. 4–7. Referring first to FIG. 4, a plurality of substrate layers 12 are stacked on top of one another. At this stage, substrate layers 12 are green (unfired) and form a green laminate 34. (The portion illustrated in FIG. 4 shows a cross-sectional view of only a portion of the overall green laminate 34 that ultimately forms circuit substrate assembly 10.)

The portion illustrated includes an exemplary via 24 formed of multiple via openings 22 disposed through individual substrate layers 12. However, the description herein applies equally to the other vias 24 and circuit substrate assembly 10 as a whole. In fact, during manufacture of circuit substrate 14, the vias 24 typically are filled and processed simultaneously.

Disposed beneath via 24 is at least one substrate layer 12 that does not include a via opening 22. Preferably, only a single substrate layer 12 is disposed beneath the via or vias 24 at this stage in the process. For clarity of description, the bottom substrate layer 12 shall be referred to as layer 12'.

Bottom layer 12' and the remaining green substrate layers 12 of green laminate 34 are placed on a base plate 36 of a via fill machine (not shown). Via fill machines are known to those of ordinary skill in the art and may be purchased, for example, from Pacific Trinetics Corporation of Carlsbad, Calif. 92008. Via fill machines typically utilize a vacuum applied to the vias to move desired fill material into the via.

Preferably, a sheet of relatively porous paper 38 is placed between base plate 36 and bottom layer 12'. When green laminate 34 is positioned on paper 38 and base plate 36, a vacuum is applied at base plate 36 to facilitate filling of via 24 with a conductive material 40. Paper sheet 38 and bottom layer 12' cooperate to ensure application of an even vacuum to via 24 so that conductive material 40 is forced throughout via 24.

The above-described method of filling vias 24 often is referred to as an extrusion process. When a sufficient amount of conductive material 40 is disposed above a desired via 24 and a vacuum is created in the via 24, the external pressure is utilized to effectively extrude the conductive materials throughout the via 24. An air impermeable sheet may be placed over the conductive material 40 prior to extruding it to further take advantage of the pressure differential created by the vacuum applied at via 24. Regardless of the specific method used to fill via 24, it is desirable to have conductive material 40 fully dispersed throughout the via.

Furthermore, the extrusion process potentially can be carried out with or without paper sheet 38 and with additional bottom substrate layers 12'. However, the inventors have determined that the natural porosity of a single green layer of substrate combined with a paper sheet provides adequate vacuum with sufficient disbursement of the vacuum to facilitate filling of via 24.

Conductive material 40 usually is a metallized conductive material. The material chosen should have appropriate solder acceptance qualities, and its percent shrinkage during firing should be compatible with the shrinkage of the green substrate layers 12 during firing. A preferred conductive material is Platinum-Gold Via Fill Material for the Green Tape System, Product Number 5739Y, available from DuPont Microelectronics.

After via or vias 24 are filled, additional green substrate layers 12 (labeled 12" for clarity) are disposed beneath bottom substrate layer 12'. Similarly, additional green substrate layers 12 (labeled 12'" for clarity) are disposed above the filled via 24 to substantially enclose via 24 and complete green laminate 34. A vent 42 is formed through green laminate 34 to permit escape of gases from conductive material 40 and via 24. Without vent 42, the substrate layers 12 as well as the finished buried edge connectors 30 may incur damage, such as blistering, due to trapped gases during the firing process.

In the preferred embodiment, vent 42 is formed through the green substrate layers 12''' disposed above via 24. Additionally, vent 42 preferably is located external to line 28A along which the substrate is ultimately cut, so that the vent is completely removed following completion of circuit substrate 14. Vent 42 may comprise one or more vents to each via 24 depending on the size of the subject via 24, the size of each vent or vents 42 and the type of conductive material used to fill via 24.

Figure 6:
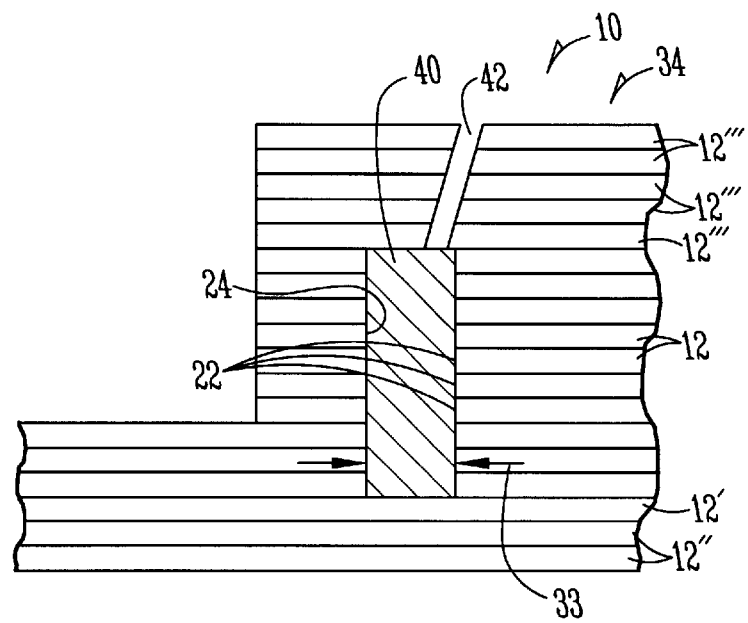
FIG. 6 is a cross-sectional view similar to that of FIG. 5 with additional layers of the circuit substrate.
Figure 7:
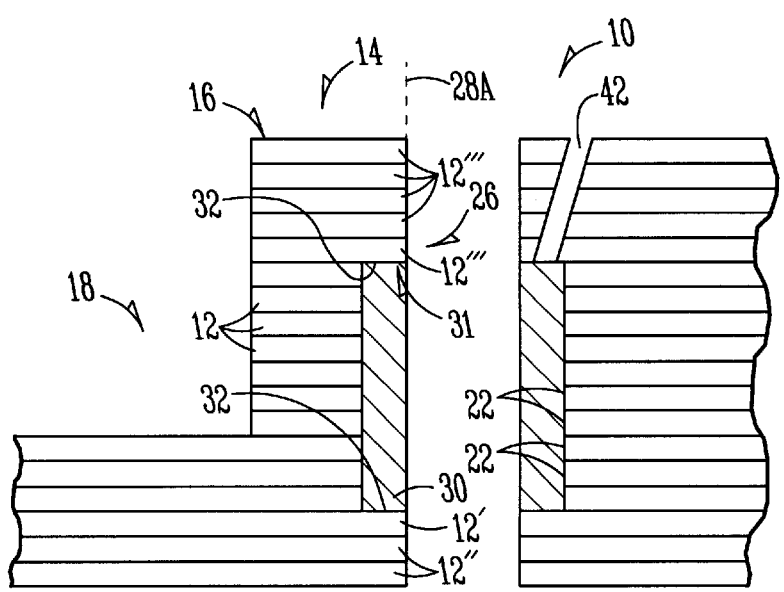
FIG. 7 is a cross-sectional view of the circuit substrate of FIG. 6 following firing and dicing of the circuit substrate.

After completion of the green laminate 34 as illustrated in FIG. 6, it is fired and diced, as illustrated in FIG. 7. Following the dicing operation, the circuit substrate 14 is separated for use in a desired device.

As will be apparent to those of ordinary skill in the art, the present invention is directed to buried edge connectors and the method of successfully forming durable buried edge connectors. The actual layout of the circuitry on the circuit substrate 14 and the connection of that circuitry to the buried edge connectors 30 varies depending on the ultimate application of circuit substrate 14. The circuit layouts and connections to buried edge connectors 30 can be accomplished as traditionally done and understood by those of ordinary skill in the art.

It will be understood that the foregoing description is of a preferred exemplary embodiment of this invention and that the invention is not limited to the specific form shown. For example, the present inventive method lends itself to a variety of circuit substrates other than ISRs; various materials, used now or in the future, can be implemented to form the layers of the substrate; various metallized and non-metallized conductive materials may be used to form the buried edge connectors; the size and shape of the vias can be modified according to the desired application; and the buried edge connectors can be disposed along one or more edges of the substrate. These and other modifications may be made in the design and arrangement of the elements without departing from the scope of the invention as expressed in the appended claims.

What is claimed is:

1. A method for providing metallized conductors along an edge of a circuit board, comprising:
   stacking a plurality of layers of a substrate used in formation of the circuit board;
   forming at least one via through the plurality of layers;
   filling the at least one via with a metallized conductive material;
   covering the at least one via with a cover layer; and
   providing a vent to the at least one via to exhaust any gases created during processing;
   dicing the plurality of layers through the at least one via at a position offset from the vent metallized conductive material is exposed which is substantially perpendicular relative to a major surface of the plurality of layers.

2. The method as recited in claim 1, further comprising firing the plurality of layers and the metallized conductive material.

3. The method as recited in claim 1, further comprising placing a bottom layer to the substrate beneath the at least one via.

4. The method as recited in claim 3, further comprising applying a vacuum to the bottom layer during filling of the at least one via.

5. The method as recited in claim 1, wherein providing a vent includes forming the vent through the cover layer.

6. The method as recited in claim 1, wherein forming at least one via includes forming a plurality of vias in general linear alignment.

7. The method of claim 1, wherein forming at least one via comprises forming at least one aperture through each of the plurality of layers, the at least one aperture having a diameter that is greater than twice a thickness of one of the plurality of layers.

8. The method of claim 1, wherein stacking a plurality of layers of a substrate comprises stacking a plurality of layers of a green laminate.

9. The method of claim 1, wherein providing a vent comprises providing a separate vent to each of the at least one via.

10. The method of claim 1, wherein providing a vent comprises providing an aperture through the cover layer which is offset from a centerline of the at least one via.

11. A method for providing metallized conductors along an edge of a circuit board, comprising:
    stacking a plurality of layers of a substrate used in formation of the circuit board;
    forming at least one via through the plurality of layers;
    filling the at least one via with a metallized conductive material;
    covering the at least one via with a cover layer;
    providing a vent which extends through the cover layer and which is open to a top surface of the metallized conductive material within the at least one via which does not extend through the at least one via; and
    curing the substrate, wherein any gases created in the at least one via during curing are exhausted through the vent.

12. The method of claim 11, further comprising dicing the plurality of layers through the metallized conductive material to expose a surface of the metallized conductive material which is substantially perpendicular to a major surface of the layers.

13. The method of claim 11, wherein stacking a plurality of layers of a substrate comprises stacking a plurality of uncured layers of a green laminate substrate.

14. The method of claim 11 further comprising placing a single layer of the substrate beneath the at least one via and applying a vacuum to the single layer to fill the at least one via with the metallized conductive material.

15. The method of claim 11 wherein providing a vent comprises providing a separate vent to each of the at least one vias.

* * * * *

UNITED STATES PATENT AND TRADEMARK OFFICE
CERTIFICATE OF CORRECTION

PATENT NO. : 6,256,880 B1
DATED : July 10, 2001
INVENTOR(S) : Ulmer et al.

Page 1 of 1

It is certified that error appears in the above-identified patent and that said Letters Patent is hereby corrected as shown below:

Column 5, claim 1,
Line 51, delete "layer; and" and insert -- layer; --, therefor.
Line 53, delete "processing;" and insert -- processing; and --, therefor.

Signed and Sealed this

Twenty-sixth Day of February, 2002

Attest:

Attesting Officer

JAMES E. ROGAN
Director of the United States Patent and Trademark Office